United States Patent [19]

Sannomiya et al.

[11] Patent Number: 5,797,999
[45] Date of Patent: Aug. 25, 1998

[54] SOLAR CELL AND METHOD FOR FABRICATING THE SAME

[75] Inventors: Hitoshi Sannomiya, Osaka; Takashi Tomita, Nara; Shunpei Yamazaki, Setagaya-ku; Yasuyuki Arai, Atsugi, all of Japan

[73] Assignee: Sharp Kabushiki Kaisha, Osaka, Japan

[21] Appl. No.: 709,505

[22] Filed: Sep. 6, 1996

[30] Foreign Application Priority Data

Sep. 8, 1995 [JP] Japan .................. 7-231776

[51] Int. Cl.$^6$ ............................ H01L 31/0368
[52] U.S. Cl. .................. 136/258 PC; 438/97
[58] Field of Search .................. 136/258 PC; 257/65, 257/75; 438/97

[56] References Cited

U.S. PATENT DOCUMENTS

| | | | |
|---|---|---|---|
| 5,456,763 | 10/1995 | Kaschmitter et al. | 136/258 PC |
| 5,470,619 | 11/1995 | Ahn et al. | 427/578 |
| 5,484,746 | 1/1996 | Ichikawa et al. | 437/83 |
| 5,486,237 | 1/1996 | Sano et al. | 136/258 PC |
| 5,492,142 | 2/1996 | Sano | 136/258 PC |

FOREIGN PATENT DOCUMENTS

| | | |
|---|---|---|
| 64-80020 | 3/1989 | Japan . |
| 2-28315 | 1/1990 | Japan . |
| 3-108381 | 5/1991 | Japan . |
| 6-244103 | 9/1994 | Japan . |
| 6-244104 | 9/1994 | Japan . |
| 6-244105 | 9/1994 | Japan . |
| 6-296020 | 10/1994 | Japan . |

*Primary Examiner*—Nam Nguyen
*Attorney, Agent, or Firm*—David G. Conlin; George W. Neuner; Dike, Bronstein, Roberts & Cushman, LLP

[57] ABSTRACT

In a method for fabricating a solar cell, an amorphous silicon film of a first conductivity type is formed on a substrate, and nickel silicide is formed thereon. The amorphous silicon film is crystallized through heat treatment to obtain a crystalline silicon film of the first conductivity type. Residual nickel silicide on the surface of the crystalline silicon film of the first conductivity type is removed. Another crystalline silicon film of a second conductivity type is further formed on the surface of the crystalline silicon film of the first conductivity type.

29 Claims, 2 Drawing Sheets

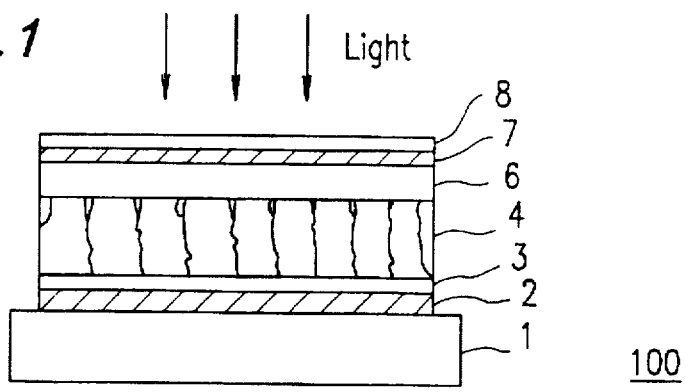
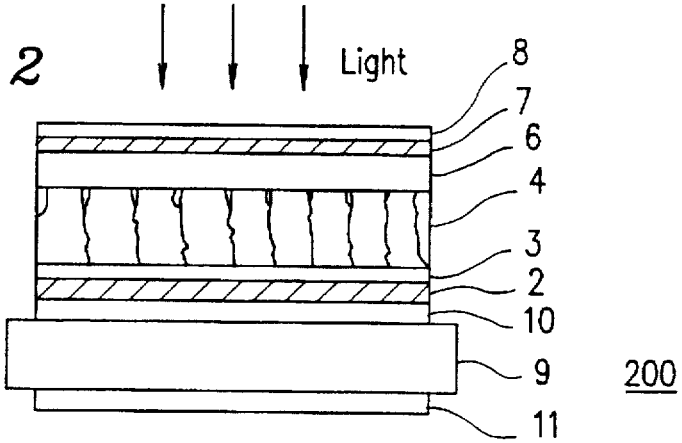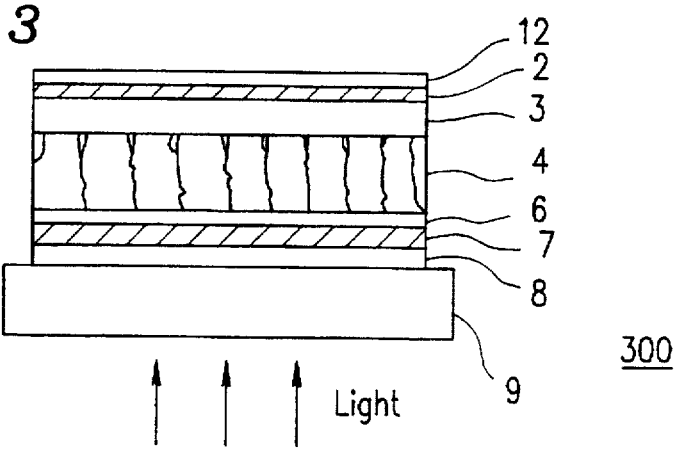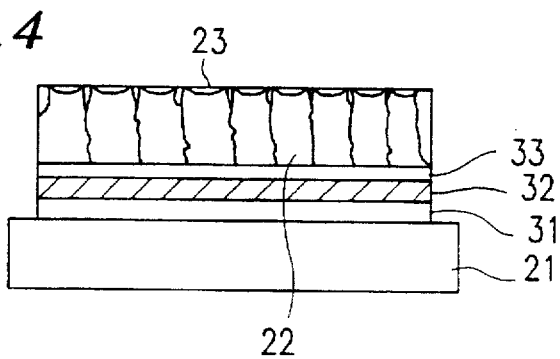

SOLAR CELL AND METHOD FOR FABRICATING THE SAME

BACKGROUND OF THE INVENTION

1. Field of the Invention

The present invention relates to a solar cell and a method for fabricating the same. More specifically, the present invention relates to a solar cell including a photoelectric converting layer formed of a crystalline silicon film and a method for fabricating the same.

2. Description of the Related Art

In recent years, a solar cell using a crystalline silicon film as a photoelectric converting layer has become an object of attention. Various methods have been proposed for forming such a crystalline silicon film. For example, a method for crystalizing an amorphous silicon film by laser annealing is disclosed in Japanese Laid-Open Patent Publication No. 1-80020; a method for forming crystalline silicon using liquid phase epitaxy (LPE) is disclosed in Japanese Laid-Open Patent Publication No. 3-108381; and a method for forming crystalline silicon using solid phase epitaxy (SPE) is disclosed in Japanese Laid-Open Patent Publication No. 2-28315.

However, it is impossible to form a high-efficiency solar cell by growing a high-quality crystalline silicon film on a substrate made of a dissimilar material other than a crystalline silicon substrate in any of these conventional methods. In addition, since the temperature required for forming a crystalline silicon film is high in any of these methods, it is necessary for a substrate material to have a heat resistance high enough to resist the crystallization temperature of silicon. Thus, the range of the materials usable for a substrate is limited and an expensive substrate is required. Consequently, the material costs and fabrication costs are adversely increased.

In conventional technologies, it is very difficult to form a high-quality crystalline silicon film on a dissimilar substrate other than a crystalline silicon substrate, and the range of the materials usable for forming crystalline silicon is limited. For example, in a method utilizing solid phase epitaxy, an amorphous silicon film is first grown on a substrate and then subjected to heat treatment, thereby crystallizing the amorphous silicon film. In this method, in general, the higher the heat treatment temperature is, the shorter the process time can be. Moreover, if the temperature is about 500° C. or lower, the crystallization of amorphous silicon hardly occurs. More specifically, in the case of treating an amorphous silicon film, which has been grown by chemical vapor deposition (CVD), with heat treatment for the film to be crystallized, the heat treatment is required to be performed for about 10 hours when the heat treatment temperature is about 600° C.

As described above, since a substrate material for a solar cell is required to exhibit high heat resistance in accordance with conventional technologies, glass quartz, carbon, ceramics or the like are used as the material. In general, these substrate materials are expensive and are not suitable for reducing the material costs of a solar cell. Thus, it is preferable to use inexpensive substrate materials which can be used more widely. However, a Corning #7059 glass substrate, used as a universal glass substrate, has a distortion point of 593° C. which is lower than the crystallization temperature of silicon in accordance with the conventional technologies. Therefore, in accordance with the conventional crystallization technologies, a Corning #7059 substrate cannot be used, because distortion and a great deal of deformation are caused in this substrate at a process temperature during the crystallization process steps.

Moreover, it is essentially impossible to form single crystalline silicon on a substrate made of a dissimilar material other than silicon and it is very difficult to form high-quality crystalline silicon having large crystal grains. This aspect has been a factor restricting the improvement of the efficiency of a solar cell.

SUMMARY OF THE INVENTION

According to the present invention, a solar cell is provided. The solar cell includes: a substrate; a crystalline silicon film of a first conductivity type which is provided over the substrate and contains nickel and hydrogen or halogen elements; and a crystalline silicon film of a second conductivity type, which is provided on a first side of the crystalline silicon film of the first conductivity type facing the substrate, or on a second side opposite the first side thereof.

According to another aspect of the present invention, a solar cell is provided. The solar cell includes: an opaque substrate having a conductive surface; a crystalline silicon film of a first conductivity type which is provided over the substrate and contains nickel and hydrogen or halogen elements; a crystalline silicon film of a second conductivity type provided on a second side of the crystalline silicon film of the first conductivity type opposite to a first side facing the substrate; and a metal collector electrode provided on a second side of the crystalline silicon film of the second conductivity type opposite to a first side facing the crystalline silicon film of the first conductivity type.

In one embodiment, the solar cell further includes: a first transparent conductive film formed between the substrate and the crystalline silicon film of the first conductivity type on a side closer to the substrate; a crystalline silicon film which is formed between the substrate and the crystalline silicon film of the first conductivity type on a side closer to the crystalline silicon film of the first conductivity type and contains impurities of the first conductivity type at a higher concentration than the crystalline silicon film of the first conductivity type; and a second transparent film formed between the crystalline silicon film of the second conductivity type and the metal collector electrode.

According to still another aspect of the present invention, a solar cell is provided. The solar cell includes: a transparent insulating substrate; a first transparent conductive film provided over a principal surface of the insulating substrate; a crystalline silicon film of a first conductivity type which is provided on a second side, opposite to a first side facing the substrate, of the first transparent conductive film and contains nickel and hydrogen or halogen elements; a crystalline silicon film of a second conductivity type provided on a second side of the crystalline silicon film of the first conductivity type, opposite to a first side facing the first transparent conductive film; and a first metal collector electrode provided on a second side of the crystalline silicon film of the second conductivity type, opposite to a first side facing the crystalline silicon film of the first conductivity type.

In one embodiment, the solar cell further includes: a second metal collector electrode formed between the substrate and the first transparent conductive film; a crystalline silicon film which is formed between the first transparent conductive film and the crystalline silicon film of the first conductivity type and contains impurities of the first conductivity type at a higher concentration than the crystalline silicon film of the first conductivity type; a second transparent conductive film formed between the crystalline silicon film of the second conductivity type and the first metal collector electrode; and a light reflective layer formed on a surface opposite to the principal surface of the substrate.

According to still another aspect of the present invention, a solar cell is provided. The solar cell includes: a transparent insulating substrate; a first transparent conductive film provided over the insulating substrate; a crystalline silicon film of a second conductivity type which is provided on a second side of the first transparent conductive film, opposite to a first side facing the substrate; a crystalline silicon film of a first conductivity type provided on a second side of the crystalline silicon film of the second conductivity type, opposite to a first side facing the first transparent conductive film, and contains nickel and hydrogen or at least one halogen element; and a metal electrode provided on a second side of the crystalline silicon film of the first conductivity type, opposite to a first side facing the crystalline silicon film of the second conductivity type.

In one embodiment, the solar cell further includes: a metal collector electrode formed between the substrate and the first transparent conductive film; a crystalline silicon film which is formed between the crystalline silicon film of the first conductivity type and the metal electrode on a side closer to the crystalline silicon film of the first conductivity type and contains impurities of the first conductivity type at a higher concentration than the crystalline silicon film of the first conductivity type; and a second transparent conductive film formed between the crystalline silicon film of the first conductivity type and the metal electrode on a side closer to the metal electrode.

In another embodiment, the concentration of nickel contained in the crystalline silicon film of the first conductivity type is in an approximate range from about $1 \times 10^{15}$ cm$^{-3}$ to about $1 \times 10^{19}$ cm$^{-3}$, both inclusive, and the concentration of the hydrogen or the halogen elements contained in the crystalline silicon film of the first conductivity type is in an approximate range from about $1 \times 10^{18}$ cm$^{-3}$ to about $1 \times 10^{21}$ cm$^{-3}$, both inclusive.

In still another embodiment, the substrate is made of a metal having a heat resistance to a temperature of about 550° C. or higher.

In still another embodiment, the substrate is made of glass having a distortion point of about 550° C. to about 670° C.

In still another embodiment, a surface of the first transparent conductive film is formed in a rough shape.

According to still another aspect of the present invention, a method for fabricating a solar cell is provided. The method includes the steps of: forming an amorphous silicon film of a first conductivity type on a substrate; forming nickel silicide on a second side of the amorphous silicon film, opposite to a first side facing the substrate; treating the amorphous silicon film with heat, thereby turning the amorphous silicon film into a crystalline silicon film of the first conductivity type; removing residual nickel silicide on a surface of the crystalline silicon film of the first conductivity type; and forming a crystalline silicon film of a second conductivity type on the surface of the crystalline silicon film of the first conductivity type.

According to still another aspect of the present invention, a method for fabricating a solar cell is provided. The method includes the steps of: forming a crystalline silicon film of a second conductivity type on a substrate; forming an amorphous silicon film of a first conductivity type on a second side of the crystalline silicon film of the second conductivity type, opposite to a first side facing the substrate; forming nickel silicide on a second side of the amorphous silicon film, opposite to a first side facing the substrate; treating the amorphous silicon film with heat, thereby turning the amorphous silicon film into a crystalline silicon film of the first conductivity type; and removing residual nickel silicide on a surface of the crystalline silicon film of the first conductivity type.

In one embodiment, the step of forming nickel silicide further includes a step of applying a nickel complex onto the surface of the amorphous silicon film and then treating the complex with heat.

In another embodiment, the step of forming nickel silicide further includes a step of forming an island-shaped nickel film by a vapor deposition method or a sputtering method on the surface of the amorphous silicon film and then treating the nickel film with heat.

In still another embodiment, the nickel is made to dispersively exist on the surface of the amorphous silicon film.

In still another embodiment, the concentration of nickel contained in the crystalline silicon film of the first conductivity type is in an approximate range from about $1 \times 10^{15}$ cm$^{-3}$ to about $1 \times 10^{19}$ cm$^{-3}$, both inclusive, and the concentration of the hydrogen or halogen elements contained in the crystalline silicon film of the first conductivity type is in an approximate range from about $1 \times 10^{18}$ cm$^{-3}$ to about $1 \times 10^{21}$ cm$^{-3}$, both inclusive.

In still another embodiment, the crystalline silicon film of the second conductivity type is formed by a CVD method or a thermal diffusion method.

In still another embodiment, the step of forming the amorphous silicon film of the first conductivity type further includes the steps of: forming a first amorphous silicon film containing impurities of the first conductivity type at a high concentration; and forming a second amorphous silicon film containing impurities of the first conductivity type at a lower concentration than the first amorphous silicon film.

According to the present invention, by forming nickel silicide on a surface of an amorphous silicon film formed on a substrate and treating the nickel silicide with heat, the amorphous silicon film is crystallized around the nickel silicide as a nucleus, thereby forming a crystalline silicon film. In this method, the diameter of the crystal grains to be formed is fundamentally different from that of the crystal grains obtained by a conventional solid phase epitaxy method. That is to say, in the conventional solid phase epitaxy method, the nucleii for crystallization are generated at random in an amorphous silicon film, so that the crystal orientations of the resulting crystal grains also are random. Thus, the diameter of the crystal grains cannot be sufficiently large. On the other hand, according to the present invention, since the crystallization proceeds around the nickel silicide formed on the surface of an amorphous silicon film as a nucleus, it is possible to form a crystalline silicon film, in which the crystal grains have a large diameter and have satisfactorily aligned crystal orientations, unlike a random crystal growth achieved by the conventional solid phase epitaxy method.

In addition, according to the present invention, a high-quality polycrystalline silicon film having a smaller number of grain boundaries crossing the thickness direction of the film can be obtained owing to the above-described features regarding the crystallinity. As a result, it is possible to suppress the effects of the grain boundaries upon the horizontal direction. This feature is suitable for a device like a solar cell, in which the carriers run in the thickness direction of a film.

Furthermore, during the crystal growth according to the present invention, there are some crystal nucleii generated at random in the amorphous silicon film. However, by using the nickel silicide formed on the surface of the amorphous silicon film as a nucleus for the crystal growth, the crystallization is realized at a temperature lower than a crystallization temperature by conventional technologies by several tens of degrees. As a result, the number of the nucleii generated at random becomes very small and a polycrystalline silicon film of high quality can be obtained.

Thus, the invention described herein makes possible the advantages of (1) providing a solar cell having enhanced photoelectric conversion efficiency which is fabricated on an inexpensive substrate such as a metal substrate or a glass substrate by using a high-quality crystalline silicon film having large crystal grains, and (2) providing a method for fabricating the same.

These and other advantages of the present invention will become apparent to those skilled in the art upon reading and understanding the following detailed description with reference to the accompanying figures.

BRIEF DESCRIPTION OF THE DRAWINGS

FIG. 1 is a cross-sectional view showing a structure for a solar cell in a first example of the present invention.

FIG. 2 is a cross-sectional view showing a structure for a solar cell in a second example of the present invention.

FIG. 3 is a cross-sectional view showing a structure for a solar cell in a third example of the present invention.

FIG. 4 is a cross-sectional view illustrating the growth of a crystalline silicon film according to the present invention.

DESCRIPTION OF THE PREFERRED EMBODIMENTS

Figure 5:
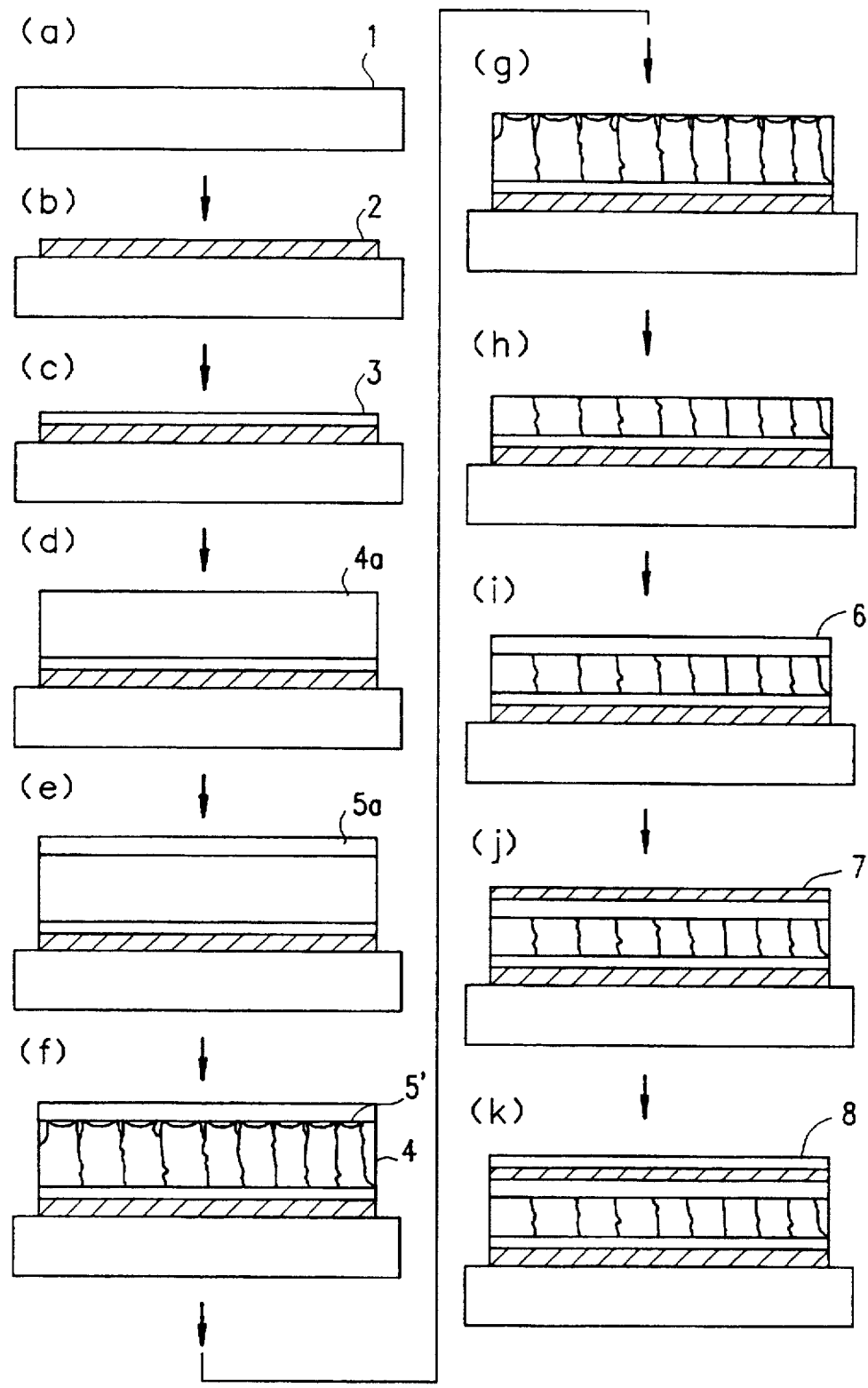
FIG. 5 is a cross-sectional view showing the process steps for fabricating the solar cell according to the present invention.

Hereinafter, the embodiments of the present invention will be described.

In the solar cell according to the present invention, by forming a silicide on the surface of an amorphous silicon film formed on the substrate and treating the silicide with heat, the amorphous silicon film is crystallized around the silicide as a nucleus, thereby forming a crystalline silicon film, which is to be used as a photoelectric converting layer. In general, silicon reacts with various kinds of metals to form an alloy called "silicide". The present inventors have obtained experimental results that it is most preferable to use nickel silicide as nuclei for crystal growth. By crystallizing the amorphous silicon film using nickel silicide formed on the surface of the amorphous silicon film as a nucleus, it is possible to obtain a crystalline silicon film, in which the crystal orientations of the crystal grains are satisfactorily aligned, unlike a random crystal growth by a conventional solid phase epitaxy method.

Hereinafter, the growth of a crystalline silicon film will be described with reference to FIG. 4. FIG. 4 shows, as a part of a solar cell, a part of a silicon film 22 to be obtained by the crystal growth. More specifically, a state where nickel silicide 23 is formed on the surface of an amorphous silicon film formed on a substrate 21 and then treated with heat is shown in FIG. 4.

First, an amorphous silicon film of a first conductivity type is formed on the substrate 21 by a plasma CVD method, a thermal CVD method, a sputtering method or the like. Nickel silicide 23 is further formed on the upper surface of the amorphous silicon film. The amorphous silicon film is formed so as to be about 10 μm thick. Any method can be used for forming the amorphous silicon film. However, since a film having a relatively large thickness is formed, it is preferable to use a method realizing a high rate of formation.

A nickel film for forming the nickel silicide 23 is formed on the surface of the amorphous silicon film so as to have a uniform thickness by applying a nickel complex onto the surface of the film or by the vapor deposition or the sputtering of nickel. It is noted that the nickel film is preferably formed dispersively so as not to cover the entire surface of the amorphous silicon film. The reason is as follows. If the nickel film covers the entire surface of the amorphous silicon film, the crystallization is generated around the entire surface of the amorphous silicon film as nuclei in forming the nickel silicide by a heat treatment. Thus, an interference with the crystal growth between adjacent regions occurs, so that the crystal growth is adversely obstructed and the diameter of the resulting crystal grains sometimes becomes smaller.

When the heat treatment is performed in the state where nickel has been dispersed on the surface of the amorphous silicon film, the nickel silicide 23 is appropriately formed on the surface of the amorphous silicon film. By further continuing the heat treatment at a temperature of about 550° C., the silicon crystals begin to grow around the nickel silicide 23 as nuclei. While gradually extending in a lateral direction, i.e., in a direction along the surface of the substrate 21, the crystalline silicon grows also in the thickness direction of the film. During the growth, the silicon crystal comes into contact with the adjacent silicon crystal which has grown around the adjacent nickel silicide as a nucleus, so that the boundary between these crystals becomes a grain boundary. The crystalline silicon film 22 of a first conductivity type is thus formed by such a crystallization. By dispersing nickel existing on the surface of the amorphous silicon film so as to adjust the surface density of the nickel silicide 23 to an appropriate value, it is possible to sufficiently increase the diameter of the silicon crystal grains in the crystalline silicon film 22 to be formed. After the crystallization is complete, residual nickel silicide on the surface of the crystalline silicon film 22 of the first conductivity type thus formed is removed by etching.

The crystalline silicon film 22 thus obtained is a high-quality polycrystalline silicon film, in which the crystal grains have a larger diameter and have a smaller number of grain boundaries crossing the thickness direction of the film, as compared with a crystalline silicon film obtained by a conventional solid phase epitaxy method, in which the crystal growth nucleii are generated at random. In the case of a device such as a solar cell in which the carriers run in the thickness direction of the film, the grain boundaries existing so as to cross the horizontal direction affect the operational characteristics of the device less. However, if the grain boundaries crossing the thickness direction of the film exist, the mobility of the carriers is decreased, so that the operational characteristics of the device are possibly deteriorated. Therefore, a polycrystalline silicon film 22 formed by the above-described method is suitable for forming a solar cell.

Nickel is contained in the crystalline silicon film 22 of the first conductivity type, and hydrogen or halogen elements are further contained therein.

Nickel has been mixed into the film as a result of the diffusion from the nickel silicide 23. If the concentration of nickel is less than about $1 \times 10^{15}$ cm$^{-3}$, the crystallization of amorphous silicon is not promoted. On the other hand, if the concentration of nickel exceeds about $1 \times 10^{19}$ cm$^{-3}$, then defect levels are formed so that silicon crystals of high quality cannot be obtained. When the nickel concentration is in an approximate range from about $1 \times 10^{15}$ cm$^{-3}$ to about $1 \times 10^{19}$ cm$^{-3}$, both inclusive, the electrical and optical characteristics of the solar cell to be formed are not adversely affected.

The hydrogen or halogen elements have been added during the formation of the amorphous silicon film. The concentration thereof is preferably in an approximate range from about $1 \times 10^{18}$ cm$^{-3}$ to about $1 \times 10^{21}$ cm$^{-3}$, both inclusive. In such a case, it is possible to compensate for the dangling bonds of silicon and to decrease the threshold energy of the crystallization, thereby reducing the distortion.

Next, a crystalline silicon film of a second conductivity type having a thickness of about 50 nm is formed, by a CVD method or a thermal diffusion of impurities, on the surface of the crystalline silicon film 22 of the first conductivity type thus obtained. If micro crystals are formed by a CVD method for the crystalline silicon film of the second conductivity type, then a satisfactory junction can be formed between the crystalline silicon film 22 of the first conductivity type and the crystalline silicon film of the second conductivity type. Thus, it is preferable to employ this method.

Alternatively, the crystalline silicon film of the second conductivity type can be formed first and then on the surface thereof the crystalline silicon film 22 of the first conductivity type can be formed in the above-described manner.

In the above-described method according to the present invention, a crystalline silicon film can be formed at a relatively low temperature of about 550° C. around nickel silicide formed on the surface of the amorphous silicon film as nuclei. Thus, a metal substrate made of a material, such as stainless steel, having a heat resistance to a temperature of about 550° C. or higher, or a glass substrate having a distortion point of about 550° C. to about 670° C., can be used as the substrate.

Furthermore, a transparent conductive film is formed as an electrode on the surface of the metal substrate made of a material such as stainless steel, the glass substrate or the like. In such a case, when a transparent conductive film is formed so as to have a rough surface, the length of the optical path of light can be extended so that the light can be advantageously utilized more efficiently.

In FIG. 4, a multi-layer structure consisting of a plurality of layers 31 to 33 is formed between the substrate 21 and the crystalline silicon film 22.

In the case where the substrate 21 is opaque, the amorphous silicon film of the first conductivity type can be directly formed on the substrate 21 when the substrate 21 is a conductive substrate made of a metallic material or the like. On the other hand, when the substrate 21 has no conductivity, a layer having a conductivity is formed thereon. Preferably, a metal layer having a high reflectance in which diffusion is not caused at a temperature of about 550° C. is further formed as a reflective layer on the conductive layer. The crystalline silicon film 22 of the first conductivity type containing nickel and hydrogen or halogen elements is formed in the above-described manner on the conductive layer or on the reflective layer when the reflective layer is formed on the conductive layer. The crystalline silicon of the second conductivity type is further formed thereon by a thermal diffusion method or a vapor phase epitaxy method. A comb-shaped metal collector electrode is formed thereon as a surface electrode.

A first transparent conductive film is formed between the substrate 21 and the crystalline silicon film 22 of the first conductivity type, or between the conductive layer and the crystalline silicon film 22 of the first conductivity type (in the case where the conductive film is provided on the substrate 21) for efficiently utilizing the reflection of the light by the bottom surface (i.e., the surface opposite to the light incoming side). When the reflective layer is formed, the first transparent conductive film is formed on the reflective layer.

It is preferable to form a crystalline silicon film (e.g., a microcrystalline silicon film) containing impurities of the first conductivity type at a higher concentration than the crystalline silicon film 22 of the first conductivity type as a back surface field (BSF) layer on the first transparent conductive film. In addition, it is also preferable to form a second transparent conductive film between the crystalline silicon film of the second conductivity type and the metal collector electrode. When the thickness of the second transparent conductive film is set to be about 10 nm to about 200 nm, the second transparent conductive film can also function as an antireflection film.

In a structure where the light is incident from the solar cell formed side of the transparent insulating substrate 21 such as a glass substrate, the first transparent conductive film is formed on the substrate 21. The crystalline silicon film 22 of the first conductivity type containing nickel and hydrogen or halogen elements is formed in the above-described manner on the first transparent conductive film. The crystalline silicon film of the second conductivity type is formed thereon by a thermal diffusion method or a vapor phase epitaxy method. A comb-shaped metal collector electrode is formed thereon as a surface electrode.

A metal collector electrode is formed between the substrate 21 and the first transparent conductive film. It is preferable to form a crystalline silicon film (e.g., a microcrystalline silicon film) containing impurities of the first conductivity type at a higher concentration than the crystalline silicon film 22 of the first conductivity type so as to act as a BSF layer between the first transparent conductive film and the crystalline silicon film 22 of the first conductivity type. In addition, it is also preferable to form a second transparent conductive film between the crystalline silicon film of the second conductivity type and the comb-shaped collector electrode. On the other hand, it is preferable to form a metal reflective film made of aluminum, silver or the like on the opposite surface of the substrate 21 as a light reflective layer.

In a structure where the light is incident through a transparent insulating substrate such as a glass substrate, the first transparent conductive film is formed on the substrate 21. The crystalline silicon film of the second conductivity type is formed as the first transparent conductive film. The crystalline silicon film 22 of the first conductivity type containing nickel and hydrogen or halogen elements is then formed thereon in the above-described manner. The comb-shaped metal collector electrode is formed on the crystalline silicon film 22 of the first conductivity type as a surface electrode.

A first metal collector electrode is formed between the substrate 21 and the first transparent conductive film. It is preferable to form a crystalline silicon film (e.g., a microcrystalline silicon film) containing impurities of the first conductivity type at a higher concentration than the crystalline silicon film of the first conductivity type as a BSF layer between the crystalline silicon film 22 of the first conductivity type and the metal collector electrode. In addition, it is also preferable to form a second transparent conductive film thereon.

The BSF layer is formed by a plasma CVD method or the like so as to have a thickness of about 50 nm to about 200 nm, preferably about 100 nm. The concentration of the impurities of the first conductivity type contained in the BSF layer is set to be higher than that of the crystalline silicon film 22 of the first conductivity type. Alternatively, upon forming an amorphous silicon film, a first amorphous silicon film containing the impurities of the first conductivity type at a high concentration and a second amorphous silicon film containing the impurities of the first conductivity type at a lower concentration than that of the first amorphous silicon film can be formed. Nickel silicide is formed on the surface of the second amorphous silicon film and then heat treatment of these films is conducted. Thus, the crystalline silicon film of the first conductivity type and the BSF layer can be simultaneously formed.

Hereinafter, the present invention will be described by way of illustrative examples with reference to the accompanying drawings.

EXAMPLE 1

In this example, a solar cell 100 is fabricated by using a metal substrate 1, which is an opaque electrically conductive substrate. FIG. 1 is a cross-sectional view showing the structure of the solar cell 100 in the first example and FIG. 5 is a cross-sectional view showing the respective process steps for fabricating the solar cell 100.

In the solar cell 100, a transparent conductive film 2 is formed on the metal substrate 1 made of stainless steel or the like. The transparent conductive film 2 may be omitted but is preferably formed for efficiently utilizing the reflection of light from the substrate. In place of the transparent conductive film 2, an insulating film such as a silicon nitride film having a refractive index of about 1.5 to about 3.0, preferably about 2.0, may be formed on the substrate 1. However, in such a case, the insulating film is required to be appropriately patterned for establishing an electrical contact between the underlying substrate 1 and the upper structure formed on the insulating film.

A BSF layer 3 of the first conductivity type is formed on the transparent conductive film 2. The BSF layer 3 may be omitted, but is preferably formed since the BSF layer 3 can advantageously improve the photoelectric conversion efficiency. A crystalline silicon film 4 of the first conductivity type containing nickel and hydrogen or halogen elements is formed on the BSF layer 3, and a microcrystalline silicon film 6 of the second conductivity type is formed thereon. A transparent conductive film 7 is formed on the microcrystalline silicon film 6 of the second conductivity type, and a comb-shaped collector electrode 8 is formed thereon. The transparent conductive film 7 may be omitted. However, in such a case, it is preferable to form a film having a refractive index of about 1.0 to about 3.0, preferably about 2.0, as an antireflection film on the micro-crystalline silicon film 6 of the second conductivity type.

The solar cell 100 can be fabricated in the following manner.

First, as shown in step (a) of FIG. 5, a metal substrate 1 made of stainless steel or the like is prepared. Next, as shown in step (b) of FIG. 5, a transparent conductive film 2 is formed on the metal substrate 1 by a vapor deposition method or a sputtering method. Subsequently, as shown in step (c) of FIG. 5, a microcrystalline silicon film 3 of the first conductivity type is formed on the transparent conductive film 2 by a plasma CVD method so as to have a thickness of about 50 nm to about 200 nm, preferably about 100 nm. This microcrystalline silicon film 3 functions as a BSF layer 3 and the impurity concentration of the microcrystalline silicon film 3 is required to be higher than that of an amorphous silicon film to be described later.

Next, as shown in step (d) of FIG. 5, an amorphous silicon film 4a is formed on the BSF layer 3. Any method may be used for forming the amorphous silicon film 4a. However, since the amorphous silicon film 4a is required to be formed to be about 10 μm thick, a method realizing a high rate of formation is preferably used. It is preferable to add impurities of the first conductivity type to the amorphous silicon film 4a. Alternatively, a substantially intrinsic amorphous silicon film, to which no impurities are added, may also be used.

Thereafter, the substrate 1 on which these layers are formed is immersed in ammonia, or ammonium hydroxide, containing an excess amount of water and held therein at about 70° C. for about five minutes, thereby forming an oxide film (not shown) on the surface of the amorphous silicon film 4a. This oxide film is formed for improving the wettability of the amorphous silicon film 4a with respect to a nickel acetate solution during the succeeding process step of applying a nickel acetate solution.

Next, as shown in step (e) of FIG. 5, the nickel acetate solution is applied as a nickel complex by a spin coating method onto the surface of the amorphous silicon film 4a. Nickel silicide 5' is formed from the applied nickel 5a to function as crystal nuclei for crystallizing the amorphous silicon film 4a. In order to obtain a high-quality crystalline silicon film, the nickel concentration in the amorphous silicon film 4a is preferably in an approximate range from about $1 \times 10^{15}$ cm$^{-3}$ to about $1 \times 10^{19}$ cm$^{-3}$, both inclusive. In this process step, instead of applying a nickel complex, nickel 5a may be deposited by a vacuum evaporation method or a sputtering method so as to be about 50 nm thick, thereby forming an island-shaped nickel film.

Subsequently, the substrate 1 on which the respective layers are formed is held within a nitrogen environment at about 450° C. for about an hour, whereby a part of the hydrogen contained in the amorphous silicon film 4a is dissociated to obtain a predetermined hydrogen concentration. For example, by setting the hydrogen concentration in an approximate range from about $1 \times 10^{18}$ cm$^{-3}$ to about $1 \times 10^{21}$ cm$^{-3}$, both inclusive, dangling bonds are intentionally formed in the amorphous silicon film 4a, so that the threshold energy for crystallizing silicon during a subsequent process step can be decreased.

Thereafter, as shown in step (f) of FIG. 5, the substrate 1 on which the respective layers are formed is subjected to heat treatment within a nitrogen environment at about 550° C. for about 4 to about 8 hours, whereby the amorphous silicon film 4a is crystallized. The crystallization is realized at a temperature as low as about 550° C. because nickel silicide 5' on the amorphous silicon film 4a functions as nuclei for the crystal growth. As a result, a crystalline silicon film 4 of the first conductivity type is formed. After the silicon crystals are grown in this way, residual nickel 5a and nickel silicide 5' on the surface of the crystalline silicon film 4 of the first conductivity type are removed by etching using hydrofluoric-nitric acid (i.e., a mixed solution of hydrogen fluoride and nitric acid), as shown in steps (g) and (h) of FIG. 5.

Next, as shown in step (i) of FIG. 5, a microcrystalline silicon film 6 of the second conductivity type is formed by a plasma CVD method on the surface of the crystalline silicon film 4 of the first conductivity type so as to have a thickness of about 50 nm. Then, as shown in step (j) of FIG. 5, a transparent conductive film 7 is formed on the surface of the microcrystalline silicon film 6 of the second conductivity type and then a comb-shaped collector electrode 8 is formed thereon as shown in step (k) of FIG. 5, thereby completing the solar cell 100.

Since the solar cell 100 thus obtained uses as a photoelectric converting layer the high-quality crystalline silicon film 4 in which the crystal grains have a large grain diameter and a small number of grain boundaries crossing the thickness direction of the film, the conversion efficiency can be improved. In addition, since the crystalline silicon film 4 of the first conductivity type can be formed at a low temperature of about 550° C., the substrate 1 is not deformed owing to the heat treatment even when an inexpensive metal substrate is used as the substrate 1.

EXAMPLE 2

In this second example, a solar cell 200 is fabricated by using a glass substrate 9 which is a transparent insulating substrate. The solar cell 200 has a structure in which light is incident from above the solar cell structure. FIG. 2 is a cross-sectional view showing the structure of the solar cell 200.

In this solar cell 200, a metal collector electrode 10 is formed on the glass substrate 9. A transparent conductive film 2 is formed on the collector electrode 10. A BSF layer 3 of the first conductivity type is formed on the transparent conductive film 2. A crystalline silicon film 4 of the first conductivity type containing nickel and hydrogen or halogen elements is formed on the BSF layer 3, and a microcrystalline silicon film 6 of the second conductivity type is formed on the crystalline silicon film 4.

A transparent conductive film 7 is formed on the microcrystalline silicon film 6 of the second conductivity type, and a comb-shaped collector electrode 8 is formed on the transparent conductive film 7. The transparent conductive film 7 may be omitted. However, in such a case, it is preferable to form a film having a refractive index of about 1.0 to about 3.0, preferably about 2.0, as an antireflection film on the microcrystalline silicon film 6 of the second conductivity type. A metal film 11 is formed on a surface, opposite to the surface on which the solar cell structure is formed, of the glass substrate 9. This metal film 11 can reflect light, which has been incident onto but has not been absorbed into the solar cell structure, so that the light can be incident again onto the solar cell. As a result, the absorption ratio of the light can be increased.

This solar cell 200 can be fabricated in the following manner.

First, a metal collector electrode 10 is formed on a glass substrate 9. A glass substrate having a distortion point of about 550° C. to about 670° C., e.g., a Corning #7059 glass substrate (manufactured by Corning Inc.; having a distortion point of about 593° C.) can be used as the glass substrate 9. Alternatively, a Corning #1773 glass substrate (manufactured by Corning Inc.; having a distortion point of about 640° C.) or an AN glass substrate (manufactured by Asahi Glass Co., Ltd.; having a distortion point of about 616° C. to about 665° C.) may also be used. In addition, a metal having a relatively high melting point which is less likely to diffuse into silicon at about 550° C. is preferably used for the metal collector electrode 10.

Next, a transparent conductive film 2 is formed on the metal collector electrode 10. This transparent conductive film 2 preferably is made of a material such as an indium tin oxide (ITO) alloy, zinc oxide (ZnO) or tin oxide ($SnO_2$), and preferably has a thickness of about 0.1 μm to about 1 μm.

Subsequently, a microcrystalline silicon film 3 of the first conductivity type is formed on the transparent conductive film 2 by a plasma CVD method so as to have a thickness of about 50 nm to about 200 nm, preferably about 100 nm. This microcrystalline silicon film 3 functions as a BSF layer 3, and the impurity concentration of the microcrystalline silicon film 3 is required to be higher than that of an amorphous silicon film to be described later.

Next, an amorphous silicon film is formed on the BSF layer 3. Any method may be used for forming the amorphous silicon film. However, since the amorphous silicon film is required to be formed to be about 10 μm thick, a method realizing a high rate of formation is preferably used. It is preferable to add impurities of the first conductivity type to the amorphous silicon film. Alternatively, a substantially intrinsic amorphous silicon film, to which no impurities are added, may also be used.

Thereafter, the substrate 9 on which these layers are formed is immersed in ammonia, or ammonium hydroxide, containing an excess amount of water and held at about 70° C. for about five minutes, thereby forming an oxide film (not shown) on the surface of the amorphous silicon film. This oxide film is formed for improving the wettability of the amorphous silicon film with respect to a nickel acetate solution during the succeeding process step of applying a nickel acetate solution.

Next, the nickel acetate solution in the form of a nickel complex is applied by a spin coating method onto the surface of the amorphous silicon film. Nickel silicide is formed from the applied nickel to function as crystal nuclei for crystallizing the amorphous silicon film. In this process step, instead of applying a nickel complex, nickel may be deposited by a vacuum evaporation method or a sputtering method so as to be about 50 nm thick, thereby forming an island-shaped nickel film.

Subsequently, the substrate 9 on which the respective layers are formed is held within a nitrogen environment at about 450° C. for about an hour, whereby a part of the hydrogen contained in the amorphous silicon film is dissociated to obtain a predetermined hydrogen concentration. As a result, dangling bonds are intentionally formed in the amorphous silicon film, so that the threshold energy for crystallizing silicon during a subsequent process step can be decreased.

Thereafter, the substrate 9 on which the respective layers are formed is subjected to heat treatment within a nitrogen environment at about 550° C. for about 4 to about 8 hours, thereby crystallizing the amorphous silicon film. The crystallization is realized at a temperature as low as about 550° C. because nickel silicide on the amorphous silicon film functions as nuclei for the crystal growth. As a result, a crystalline silicon film 4 of the first conductivity type is formed. After the silicon crystals are grown in this way, residual nickel and nickel silicide on the surface of the crystalline silicon film 4 of the first conductivity type are removed by etching using hydrofluoric-nitric acid (i.e., a mixture of hydrogen fluoride and nitric acid).

Next, a microcrystalline silicon film 6 of the second conductivity type is formed by a plasma CVD method on the surface of the crystalline silicon film 4 of the first conductivity type so as to have a thickness of about 50 nm. Then, a transparent conductive film 7 is formed on the surface of the microcrystalline silicon film 6 of the second conductivity type and then a comb-shaped collector electrode 8 is formed thereon. Finally, a metal film 11 made of aluminum, silver or the like is formed on the surface, opposite to the surface on which the solar cell structure is formed, of the glass substrate 9, thereby completing the solar cell 200.

Since the solar cell 200 thus obtained uses as a photoelectric converting layer the high-quality crystalline silicon film 4 in which the crystal grains have a large grain diameter and a small number of grain boundaries crossing the thickness direction of the film, the conversion efficiency can be improved. In addition, since the crystalline silicon film 4 of the first conductivity type can be formed at a low temperature of about 550° C., the substrate 9 is not deformed owing to the heat treatment even when an inexpensive glass substrate is used as the substrate 9.

EXAMPLE 3

In this third example, a solar cell 300 is fabricated by using a glass substrate 9 which is a transparent insulating substrate. The solar cell 300 has a structure in which light is incident through the substrate 9. FIG. 3 is a cross-sectional view showing the structure of the solar cell 300.

In this solar cell 300, a metal collector electrode 8 is formed on the glass substrate 9. A transparent conductive film 7 is formed on the collector electrode 8. A microcrystalline silicon film 6 of the second conductivity type is formed on the transparent conductive film 7. A crystalline silicon film 4 of the first conductivity type containing nickel and hydrogen or halogen elements is formed on the microcrystalline silicon film 6, and a BSF layer 3 of the first conductivity type is formed on the crystalline silicon film 4. A transparent conductive film 2 is formed on the BSF layer 3, and a metal electrode 12 is formed on the transparent conductive film 2.

This solar cell 300 can be fabricated in the following manner.

First, the metal collector electrode 8 is formed on the glass substrate 9. A glass substrate having a distortion point of about 550° C. or higher, e.g., a Corning #7059 glass substrate (having a distortion point of about 593° C.) can be used as the glass substrate 9. Alternatively, a Corning #1773 glass substrate (having a distortion point of about 640° C.) or an AN glass substrate (having a distortion point of about 616° C. to about 665° C.) may also be used. In addition, a metal having a relatively higher melting point which is less likely to diffuse into silicon at about 550° C. is preferably used as a metal for the metal collector electrode 8.

Next, a transparent conductive film 7 is formed on the metal collector electrode 8. This transparent conductive film 7 is preferably made of a material such as an indium tin oxide (ITO) alloy, zinc oxide (ZnO) or tin oxide ($SnO_2$), and preferably has a thickness of about 0.1 µm to about 1 µm. In addition, opposite to the surface facing the substrate 9, the surface of the transparent conductive film 7 is preferably roughened. Such a roughening can extend the length of the optical path of the light incident onto the solar cell 300.

Subsequently, a microcrystalline silicon film 6 of the second conductivity type is formed by a plasma CVD method on the transparent conductive film 7 so as to have a thickness of about 50 nm to about 200 nm, preferably about 100 nm.

Next, an amorphous silicon film is formed on the microcrystalline silicon film 6. Any method may be used for forming the amorphous silicon film. However, since the amorphous silicon film is required to be formed to be about 10 µm thick, a method realizing a high rate of formation is preferably used. It is preferable to add impurities of the first conductivity type to the amorphous silicon film. Alternatively, a substantially intrinsic amorphous silicon film, to which no impurities are added, may also be used.

Thereafter, the substrate 9 on which these layers are formed is immersed in ammonia, or ammonium hydroxide, containing an excess amount of water and held at about 70° C. for about five minutes, thereby forming an oxide film (not shown) on the surface of the amorphous silicon film. This oxide film is formed for improving the wettability of the amorphous silicon film with respect to a nickel acetate solution during the succeeding process step of applying a nickel acetate solution.

Next, the nickel acetate solution as a nickel complex is applied by a spin coating method onto the surface of the amorphous silicon film. Nickel silicide is formed from the applied nickel to function as crystal nuclei for crystallizing the amorphous silicon film. In this process step, instead of applying a nickel complex, nickel may be deposited by a vacuum evaporation method or a sputtering method so as to be about 50 nm thick, thereby forming an island-shaped nickel film.

Subsequently, the substrate 9 on which the respective layers are formed is held within a nitrogen environment at about 450° C. for about an hour, whereby a part of the hydrogen contained in the amorphous silicon film is dissociated to obtain a predetermined hydrogen concentration. As a result, dangling bonds are intentionally formed in the amorphous silicon film, so that the threshold energy for crystallizing silicon during a subsequent process step can be decreased.

Thereafter, the substrate 9 on which the respective layers are formed is subjected to heat treatment within a nitrogen environment at about 550° C. for about 4 to about 8 hours, thereby crystallizing the amorphous silicon film. The crystallization is realized at a temperature as low as about 550° C. This is because nickel silicide on the amorphous silicon film functions as nuclei for the crystal growth. As a result, a crystalline silicon film 4 of the first conductivity type is formed. After the silicon crystals are grown in this way, residual nickel and nickel silicide on the surface of the crystalline silicon film 4 of the first conductivity type are removed by etching using hydrofluoric-nitric acid (or a mixture of hydrogen fluoride and nitric acid).

Next, a microcrystalline silicon film 3 of the first conductivity type is formed by a plasma CVD method on the surface of the crystalline silicon film 4 of the first conductivity type so as to have a thickness of about 50 nm. This microcrystalline silicon film 3 functions as a BSF layer 3, and the impurity concentration of the microcrystalline silicon film 3 is required to be higher than that of the crystalline silicon film 4 of the first conductivity type. Then, a transparent conductive film 2 is formed on the surface of the microcrystalline silicon film 3 of the first conductivity type. A metal film 12 made of a metallic material such as aluminum, silver or the like is formed on the transparent conductive film 2, thereby completing the solar cell 300.

Since the solar cell 300 thus obtained uses as a photoelectric converting layer the high-quality crystalline silicon film 4 in which the crystal grains have a large grain diameter and a small number of grain boundaries crossing the thickness direction of the film, the conversion efficiency can be improved. In addition, since the crystalline silicon film 4 of the first conductivity type can be formed at a low temperature of about 550° C., the substrate 9 is not deformed owing to the heat treatment even when an inexpensive glass substrate is used as the substrate 9.

The preferred embodiments of the present invention have been specifically described. However, it is not intended that the present invention is limited to the above-described embodiments. For example, although a most remarkable effect can be attained in the case of using nickel silicide as done in the foregoing examples, various silicides of Fe, Co, Ru, Rh, Pd, Os, Ir, Pt, Cu or Au may also be used instead of nickel (Ni). In addition, the heat treatment temperatures for the crystallization, the thicknesses of the respective films to be formed and the like may also be set at values other than the respective values specified in the examples.

As is apparent from the foregoing description, according to the present invention, silicide is formed on the surface of an amorphous silicon film formed on a substrate. The amorphous silicon film is treated with heat to be crystallized using the silicide as nuclei. As a result, it is possible to obtain a high-quality polycrystalline silicon film in which the crystal grains have a large grain diameter and a small number of grain boundaries crossing the thickness direction of the film, as compared with a crystalline silicon film obtained by a conventional solid phase epitaxy method. In the case of a device such as a solar cell in which the carriers run in the thickness direction of the film, the grain boundaries existing so as to cross the horizontal direction of the film affect the operational characteristics of the device less. However, if there are grain boundaries crossing the thickness direction of the film, the mobility of the carriers is decreased, so that the operational characteristics of the device are possibly deteriorated. Therefore, by using a crystalline silicon film formed by the above-described method as a photoelectric converting layer, a solar cell having a high conversion efficiency can be formed.

Nickel silicide is most suitable as the silicide used as nuclei for crystal growth. Nickel silicide can be easily formed to be appropriately distributed by applying a nickel complex onto the surface of the amorphous silicon film and then treating the nickel complex with heat. Alternatively, an island-shaped nickel film is formed on the surface of the amorphous silicon film by a vapor deposition method or a sputtering method and then treated with heat to obtain nickel silicide.

Alternatively, after impurities are added beforehand to the amorphous silicon film, a crystalline silicon film of the first conductivity type is formed by performing a crystallization process. The residual nickel silicide is removed by etching and then a crystalline silicon film of the second conductivity type is formed on the surface of the crystalline silicon film of the first conductivity type. As a result, a solar cell having a higher conversion efficiency can be obtained. As another alternative, the crystalline silicon film of the second conductivity type is first formed and then the crystalline silicon film of the first conductivity type is formed on the surface thereof. If a microcrystalline silicon film is formed as the crystalline silicon film of the second conductivity type by a CVD method, then a satisfactory junction can be formed between the crystalline silicon film of the first conductivity type and the crystalline silicon film of the second conductivity type.

When the concentration of nickel contained in the crystalline silicon film of the first conductivity type is in an approximate range from about $1\times10^{15}$ cm$^{-3}$ to about $1\times10^{19}$ cm$^{-3}$, both inclusive, the crystallization of silicon can be promoted, so that silicon crystals of high quality can be obtained. In addition, nickel does not adversely affect the electrical and optical characteristics of the solar cell to be formed. On the other hand, when the crystalline silicon film of the first conductivity type is made to contain hydrogen or halogen elements at a concentration from about $1\times10^{18}$ cm$^{-3}$ to about $1\times10^{21}$ cm$^{-3}$, both inclusive, then it is possible to compensate for the dangling bonds of silicon and to reduce the distortion.

In the solar cell according to the present invention, a crystalline silicon film can be formed at a relatively low temperature by using nickel silicide formed on the surface of the amorphous silicon film as nuclei for crystal growth. As a result, it is possible to use as the substrate an inexpensive substrate generally used, such as a metal substrate made of stainless steel or the like having heat resistance to a temperature of about 550° C. or higher, a glass substrate having a distortion point of about 550° C. to about 670° C., or the like. A transparent conductive film is formed on the surface of the metal substrate made of stainless steel or the like or the glass substrate. When the surface of the transparent conductive film is roughened, then the light can be utilized more efficiently.

By utilizing a structure in which a transparent conductive film, a BSF layer of the first conductivity type, a crystalline silicon film of the first conductivity type, a crystalline silicon film of the second conductivity type, a transparent conductive film and a metal collector electrode are sequentially deposited on a metal substrate, a solar cell having a very high conversion efficiency can be obtained. Alternatively, as another structure, a metal collector electrode, a transparent conductive film, a BSF layer of the first conductivity type, a crystalline silicon film of the first conductivity type, a crystalline silicon film of the second conductivity type, a transparent conductive film and a metal collector electrode are sequentially deposited on a glass substrate and a light reflective layer is formed on the opposite surface of the substrate. In this case, light is incident from the solar cell formed side of the glass substrate. Then, a solar cell having a very high conversion efficiency can be obtained. Furthermore, as still another structure, a metal collector electrode, a transparent conductive film, a crystalline silicon film of the second conductivity type, a crystalline silicon film of the first conductivity type, a BSF layer of the first conductivity type, a transparent conductive film and a metal collector electrode are sequentially deposited on a glass substrate, and light is incident through the glass substrate. Then a solar cell having a very high conversion efficiency can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solar cell, comprising:

a substrate;

a polycrystalline silicon film of a first conductivity type which is provided over the substrate and contains nickel and hydrogen or halogen elements; and a crystalline silicon film of a second conductivity type which is provided on a first side of the polycrystalline silicon film of the first conductivity type facing the substrate or on a second side opposite to the first side thereof.

2. A solar cell according to claim 1, wherein the concentration of nickel contained in the polycrystalline silicon film of the first conductivity type is in an approximate range from about $1 \times 10^{15}$ cm$^{-3}$ to about $1 \times 10^{19}$ cm$^{-3}$, both inclusive, and the concentration of the hydrogen or halogen elements contained in the polycrystalline silicon film of the first conductivity type is in an approximate range from about $1 \times 10^{18}$ cm$^{-3}$ to about $1 \times 10^{21}$ cm$^{-3}$, both inclusive.

3. A solar cell, comprising:

an opaque substrate having a conductive surface;

a polycrystalline silicon film of a first conductivity type which is provided over the substrate and contains nickel and hydrogen or halogen elements;

a crystalline silicon film of a second conductivity type provided on a second side of the polycrystalline silicon film of the first conductivity type opposite to a first side facing the substrate; and a metal collector electrode provided on a second side of the crystalline silicon film of the second conductivity type, opposite to a first side facing the polycrystalline silicon film of the first conductivity type.

4. A solar cell according to claim 3, further comprising:

a first transparent conductive film formed between the substrate and the polycrystalline silicon film of the first conductivity type on a side closer to the substrate;

a crystalline silicon film which is formed between the substrate and the polycrystalline silicon film of the first conductivity type on a side closer to the polycrystalline silicon film of the first conductivity type and contains dopant impurities of the first conductivity type at a higher concentration than the polycrystalline silicon film of the first conductivity type; and a second transparent film formed between the crystalline silicon film of the second conductivity type and the metal collector electrode.

5. A solar cell according to claim 3, wherein the concentration of nickel contained in the polycrystalline silicon film of the first conductivity type is in an approximate range from about $1 \times 10^{15}$ cm$^{-3}$ to about $1 \times 10^{19}$ cm$^{-3}$, both inclusive, and the concentration of the hydrogen or halogen elements contained in the polycrystalline silicon film of the first conductivity type is in an approximate range from about $1 \times 10^{18}$ cm$^{-3}$ to about $1 \times 10^{21}$ cm$^{-3}$, both inclusive.

6. A solar cell according to claim 3, wherein the substrate is made of a metal having heat resistance to a temperature of about 550° C. or higher.

7. A solar cell, comprising:

a transparent insulating substrate;

a first transparent conductive film provided over a principal surface of the insulating substrate;

a polycrystaline silicon film of a first conductivity type which is provided on a second side of the first transparent conductive film, opposite to a first side facing the substrate, and which contains nickel and hydrogen or halogen elements;

a crystalline silicon film of a second conductivity type provided on a second side of the polycrystalline silicon film of the first conductivity type, opposite to a first side facing the first transparent conductive film; and a first metal collector electrode provided on a second side opposite of the crystalline silicon film of the second conductivity type, opposite to a first side facing the polycrystalline silicon film of the first conductivity type.

8. A solar cell according to claim 7, further comprising:

a second metal collector electrode formed between the substrate and the first transparent conductive film;

a crystalline silicon film which is formed between the first transparent conductive film and the polycrystalline silicon film of the first conductivity type and contains dopant impurities of the first conductivity type at a higher concentration than the polycrystalline silicon film of the first conductivity type;

a second transparent conductive film formed between the crystalline silicon film of the second conductivity type and the first metal collector electrode; and a light reflective layer formed on a surface of the substrate opposite to the principal surface.

9. A solar cell according to claim 7, wherein the concentration of nickel contained in the polycrystalline silicon film of the first conductivity type is in an approximate range from about $1 \times 10^{15}$ cm$^{-3}$ to about $1 \times 10^{19}$ cm$^{-3}$, both inclusive, and the concentration of the hydrogen or halogen elements contained in the polycrystalline silicon film of the first conductivity type is in an approximate range from about $1 \times 10^{18}$ cm$^{-3}$ to about $1 \times 10^{21}$ cm$^{-3}$, both inclusive.

10. A solar cell according to claim 7, wherein the substrate is made of glass having a distortion point of about 550° C. to about 670° C.

11. A solar cell, comprising:

a transparent insulating substrate;

a first transparent conductive film provided over the insulating substrate;

a crystalline silicon film of a second conductivity type which is provided on a second side of the first transparent conductive film, opposite to a first side facing the substrate;

a polycrystalline silicon film of a first conductivity type provided on a second side of the crystalline silicon film of the second conductivity type, opposite to a first side facing the first transparent conductive film, and which contains nickel and hydrogen or halogen elements; and a metal electrode provided on a second side of the polycrystalline silicon film of the first conductivity type, opposite to a first side facing the crystalline silicon film of the second conductivity type.

12. A solar cell according to claim 11, further comprising:

a metal collector electrode formed between the substrate and the first transparent conductive film;

a crystalline silicon film which is formed between the polycrystalline silicon film of the first conductivity type and the metal electrode on a side closer to the polycrystalline silicon film of the first conductivity type and contains dopant impurities of the first conductivity type at a higher concentration than the polycrystalline silicon film of the first conductivity type; and a second transparent conductive film formed between the polycrystalline silicon film of the first conductivity type and the metal electrode on a side closer to the metal electrode.

13. A solar cell according to claim 11, wherein the concentration of nickel contained in the polycrystalline silicon film of the first conductivity type is in an approximate range from about $1 \times 10^{15}$ cm$^{-3}$ to about $1 \times 10^{19}$ cm$^{-3}$, both inclusive, and the concentration of the hydrogen or halogen elements contained in the polycrystalline silicon film of the first conductivity type is in an approximate range from about $1 \times 10^{18}$ cm$^{-3}$ to about $1 \times 10^{21}$ cm$^{-3}$, both inclusive.

14. A solar cell according to claim 11, wherein the substrate is made of glass having a distortion point of about 550° C. to about 670° C.

15. A solar cell according to claim 11, wherein a surface of the first transparent conductive film is roughened.

19

16. A method for fabricating a solar cell, comprising the steps of:

forming an amorphous silicon film of a first conductivity type on a substrate;

forming nickel silicide on a second side of the amorphous silicon film, opposite to a first side facing the substrate;

heat treating the amorphous silicon film thereby converting the amorphous silicon film into a polycrystalline silicon film of the first conductivity type;

removing residual nickel silicide on the surface of the polycrystalline silicon film of the first conductivity type; and forming a crystalline silicon film of a second conductivity type on the said surface of the polycrystalline silicon film of the first conductivity type.

17. A method for fabricating a solar cell according to claim 16, wherein the step of forming nickel silicide further comprises a step of applying a nickel complex onto the surface of the amorphous silicon film and then heat treating the complex.

18. A method for fabricating a solar cell according to claim 16, wherein the step of forming nickel silicide further comprises a step of forming an island-shaped nickel film by a vapor deposition method or a sputtering method on the surface of the amorphous silicon film and then heat treating the nickel film.

19. A method for fabricating a solar cell according to claim 18, wherein the nickel is dispersively formed on the surface of the amorphous silicon film.

20. A method for fabricating a solar cell according to claim 16, wherein the concentration of nickel contained in the polycrystalline silicon film of the first conductivity type is in an approximate range from about $1\times10^{15}$ cm$^{-3}$ to about $1\times10^{19}$ cm$^{-3}$, both inclusive, and the concentration of the hydrogen or halogen elements contained in the polycrystalline silicon film of the first conductivity type is in an approximate range from about $1\times10^{18}$ cm$^{-3}$ to about $1\times10^{21}$ cm$^{-3}$, both inclusive.

21. A method for fabricating a solar cell according to claim 16, wherein the crystalline silicon film of the second conductivity type is formed by a CVD method or a thermal diffusion method.

22. A method for fabricating a solar cell according to claim 16, wherein the step of forming the amorphous silicon film of the first conductivity type further comprises the steps of:

forming a first amorphous silicon film containing dopant impurities of the first conductivity type at a high concentration; and forming a second amorphous silicon film containing dopant impurities of the first conductivity type at a lower concentration than in the first amorphous silicon film.

23. A method for fabricating a solar cell, comprising the steps of:

20 forming a crystalline silicon film of a second conductivity type on a substrate;

forming an amorphous silicon film of a first conductivity type on a second side of the crystalline silicon film of the second conductivity type, opposite to a first side facing the substrate;

forming nickel silicide on a second side of the amorphous silicon film, opposite to a first side facing the substrate;

heat treating the amorphous silicon film thereby converting the amorphous silicon film into a polycrystalline silicon film of the first conductivity type; and removing residual nickel silicide on the surface of the polycrystalline silicon film of the first conductivity type.

24. A method for fabricating a solar cell according to claim 23, wherein the step of forming nickel silicide further comprises a step of applying a nickel complex onto the surface of the amorphous silicon film and then heat treating the complex.

25. A method for fabricating a solar cell according to claim 23, wherein the step of forming nickel silicide further comprises a step of forming an island-shaped nickel film by a vapor deposition method or a sputtering method on the surface of the amorphous silicon film and then heat treating the nickel film.

26. A method for fabricating a solar cell according to claim 25, wherein the nickel is dispersively formed on the surface of the amorphous silicon film.

27. A method for fabricating a solar cell according to claim 23, wherein the concentration of nickel contained in the polycrystalline silicon film of the first conductivity type is in an approximate range from about $1\times10^{15}$ cm$^{-3}$ to about $1\times10^{19}$ cm$^{-3}$, both inclusive, and the concentration of the hydrogen or halogen elements contained in the polycrystalline silicon film of the first conductivity type is in an approximate range from about $1\times10^{18}$ cm$^{-3}$ to about $1\times10^{21}$ cm$^{-3}$, both inclusive.

28. A method for fabricating a solar cell according to claim 23, wherein the crystalline silicon film of the second conductivity type is formed by a CVD method or a thermal diffusion method.

29. A method for fabricating a solar cell according to claim 23, wherein the step of forming the amorphous silicon film of the first conductivity type further comprises the steps of:

forming a first amorphous silicon film containing dopant impurities of the first conductivity type at a high concentration; and forming a second amorphous silicon film containing dopant impurities of the first conductivity type at a lower concentration than in the first amorphous silicon film.

* * * * *

UNITED STATES PATENT AND TRADEMARK OFFICE
CERTIFICATE OF CORRECTION

PATENT NO. : 5,797,999
DATED : AUGUST 25, 1998
INVENTOR(S) : Sannomiya, et al.

It is certified that error appears in the above-identified patent and that said Letters Patent is hereby corrected as shown below:

On the title page,

Item [73] Assignee: after "Sharp Kabushiki Kaisha Osaka 545, JAPAN" insert -- Semiconductor Energy Laboratory Co., Ltd., Kanagawa-ken 243, JAPAN--

Signed and Sealed this

Eighth Day of June, 1999

Attest:

Q. TODD DICKINSON

*Attesting Officer*      *Acting Commissioner of Patents and Trademarks*